United States Patent
Chen et al.

(10) Patent No.: US 6,344,995 B2
(45) Date of Patent: *Feb. 5, 2002

(54) CIRCUIT FOR CONTROLLING THE POTENTIAL DIFFERENCE BETWEEN THE SUBSTRATE AND THE CONTROL GATE ON NON-VOLATILE MEMORY AND ITS CONTROL METHOD

(75) Inventors: Wei-Fan Chen, Taichung; Ta-Lee Yu, Hsinchu Hsien, both of (TW)

(73) Assignee: Winbond Electronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/272,160

(22) Filed: Mar. 19, 1999

(30) Foreign Application Priority Data

Dec. 2, 1998 (TW) .......................................... 87120011 A

(51) Int. Cl.[7] .............................................. G11C 16/04
(52) U.S. Cl. ............................ 365/185.18; 365/185.26; 365/185.27; 365/185.29
(58) Field of Search ........................ 365/185.26, 185.18, 365/185.27, 185.29, 185.01

(56) References Cited

U.S. PATENT DOCUMENTS

| | | | |
|---|---|---|---|
| 5,406,521 A | * 4/1995 | Hara | ........................ 365/218 |
| 5,572,054 A | * 11/1996 | Wang et al. | ................. 257/322 |
| 5,894,438 A | * 4/1999 | Yang et al. | ............. 365/185.18 |
| 5,898,606 A | * 4/1999 | Kobayashi et al. | ........... 365/63 |
| 5,943,267 A | * 8/1999 | Sekariapuram et al. | 365/185.28 |
| 6,005,809 A | * 12/1999 | Sung et al. | ............. 365/185.29 |

* cited by examiner

Primary Examiner—Hoai V. Ho
(74) Attorney, Agent, or Firm—Nath&Associates PLLC; Harold L. Novick

(57) ABSTRACT

A circuit for controlling a non-volatile memory cell having a source, a drain, a control gate, and a bulk is disclosed. The control circuit comprises a voltage source, a first charge-pumping circuit, a word-line switch, a second charge-pumping circuit, a source switch, a third charge-pumping circuit, and a bulk switch. The first charge-pumping circuit, second charge-pumping circuit and third charge-pumping circuit respectively generate a first positive voltage, second positive voltage and negative voltage in response to the voltage source. The word-line switch selects and applies one of the voltage source or the first positive voltage to the control gate. The source switch selects and applies one of a ground potential or the second positive voltage to the source. The bulk switch selects and applies one of the ground potential or the negative voltage to the bulk. According to the present invention, the first positive voltage is applied to the control gate and the negative voltage is applied to the bulk during an erase operation.

9 Claims, 3 Drawing Sheets

CIRCUIT FOR CONTROLLING THE POTENTIAL DIFFERENCE BETWEEN THE SUBSTRATE AND THE CONTROL GATE ON NON-VOLATILE MEMORY AND ITS CONTROL METHOD

BACKGROUND OF THE INVENTION

1. Field of the Invention

The present invention generally relates to flash-type non-volatile memory devices. More particularly, the present invention relates to a circuit for controlling a non-volatile memory cell and its control method.

2. Description of the Related Art

Non-volatile memory devices have been widely applied to commercial electronic products on account of programmability and data retention after power-off. Referring to FIG. 1, a split gate non-volatile memory cell 10 disclosed in U.S. Pat. No. 5,572,054 is shown in a cross-sectional view. The memory cell 10 is fabricated on a semiconductor substrate 12, such as a P-type silicon substrate.

In FIG. 1, on the substrate 12 a source region 14 and a drain region 16 are defined with a channel region 18 therebteween. A first insulating layer 20, for example, made of thermally-grown silicon oxide, is disposed over the drain region 16, channel region 18, and source region 14. Disposed over the first insulating layer 20 is a floating gate 22. The floating gate 22 is positioned over a portion of the channel region 18 and over a portion of the source region 14. Preferably, the floating gate 22 can be a polysilicon gate. A second insulating layer 24 has a first portion 24A disposed over the floating gate 22 and a second portion 24B disposed adjacent to the sidewall of the floating gate 22. For example, the second insulating layer 24 can be made of silicon oxide by oxidizing the surface of the floating gate 22 while the floating gate 22 is made of polysilicon. A control gate 26 has one portion 26A disposed over the top wall portion 24A of the second insulating layer 24, and another portion 26B is disposed over the first insulating layer 20 and is immediately adjacent to the sidewall portion 24B of the second insulating layer 24. Further referring to FIG. 1, the portion 26B of the control gate 26 extends over a portion of the drain region 16 and over a portion of the channel region 18.

The operation of the conventional non-volatile memory cell 10 is described as follows.

When it is desired to erase the cell 10, a ground potential is applied to the source region 14 and to the drain region 16. A positive voltage, on the order of about +15 volts, is applied to the control gate 26. Therefore, charges on the floating gate 22 are induced through the Fowler-Nordheim tunneling mechanism to tunnel through the second insulating layer 24 to the control gate 26, leaving the floating gate 22 positively charged.

When it is desired to program selective cell 10, the ground potential is applied to the drain region 16. A positive voltage level in the vicinity of the threshold voltage of the MOS structure defined by the control gate 26 (e.g., on the order of approximately of +1V volt) is applied to the control gate 26. Another positive voltage on the order of about +13 volts is applied to the source region 14. Therefore, electrons generated by the drain region 16 will flow from the drain region 16 towards the source region 14 through a weakly inverted channel region 18. When the electrons reach the region where the control gate 26 meets the sidewall portion 24B, the electrons see a steep potential drop approximately equal to the source voltage, across the surface region defined by the gap of the sidewall 24B. The electrons will accelerate and become heated and some of them will be injected into and through the first insulating layer 20 onto the floating gate 22, leaving the floating gate 22 negatively charged.

When it is desired to read memory cell 10, the ground potential is applied to the source region 14. A conventional read voltage, such as +5 volts, is applied to the drain region 16 and to the control gate 26, respectively. If the floating gate 22 is positively charged, the entire channel region 18 directly beneath the floating gate 22 and the portion 26B of the control gate 26 will be turned on to cause electrical current to flow from the source region 14 to the drain region 16. This would be the logic "1" state. On the other hand, if the floating gate 22 is negatively charged, the channel region 18 directly beneath the floating gate 22 is either weakly turned on or is entirely shut off so that little or no current will flow through the channel region 18 directly beneath the floating gate 22. In this manner, the cell 10 is defined to be programmed at the logic "0" state.

However, the current flowing through the insulating layer 20 or 24 during the program or erase operation may build a voltage potential which is linearly proportional to the logarithmic scale of the time of current-flowing. After several erase-program cycles, the number of charges to be stored in the floating gate 22 declines gradually so as to decrease the current flowing between the source region 14 and the drain region 16 at the logic "1" state. Even worse, it can become a difficult task to identify between the logic "1" state and the logic "0" state.

Increasing the erase voltage may be a feasible approach to resolve the aforementioned problem without modifying structure of the memory cell 10 itself. However, the maximum value of the erase voltage is limited by the junction breakdown effect, and thus it can not be sufficiently increased to enhance the erase performance.

SUMMARY OF THE INVENTION

It is therefore an object of the present invention to provide a circuit for controlling a non-volatile memory cell and its control method to enhance the erase performance without modifying the memory cell itself.

The above objects can be realized by providing a circuit for controlling a non-volatile memory cell having a source, a drain, a control gate, and a bulk. The control circuit comprises a voltage source, a first charge-pumping circuit, a word-line switch, a second charge-pumping circuit, a source switch, a third charge-pumping circuit, and a bulk switch. The first charge-pumping circuit, second charge-pumping circuit and third charge-pumping circuit respectively generate a first positive voltage, second positive voltage and negative voltage in response to the voltage source. The word-line switch selects and applies one of the voltage source or the first positive voltage to the control gate. The source switch selects and applies one of a ground potential or the second positive voltage to the source. The bulk switch selects and applies one of the ground potential or the negative voltage to the bulk.

During an erase operation the first positive voltage is applied to the control gate and the negative voltage is applied to the bulk. Accordingly, the potential difference between the substrate and the control gate can be raised to increase the number of charges to be stored in the floating gate even after long-term erase-program cycles.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 1:
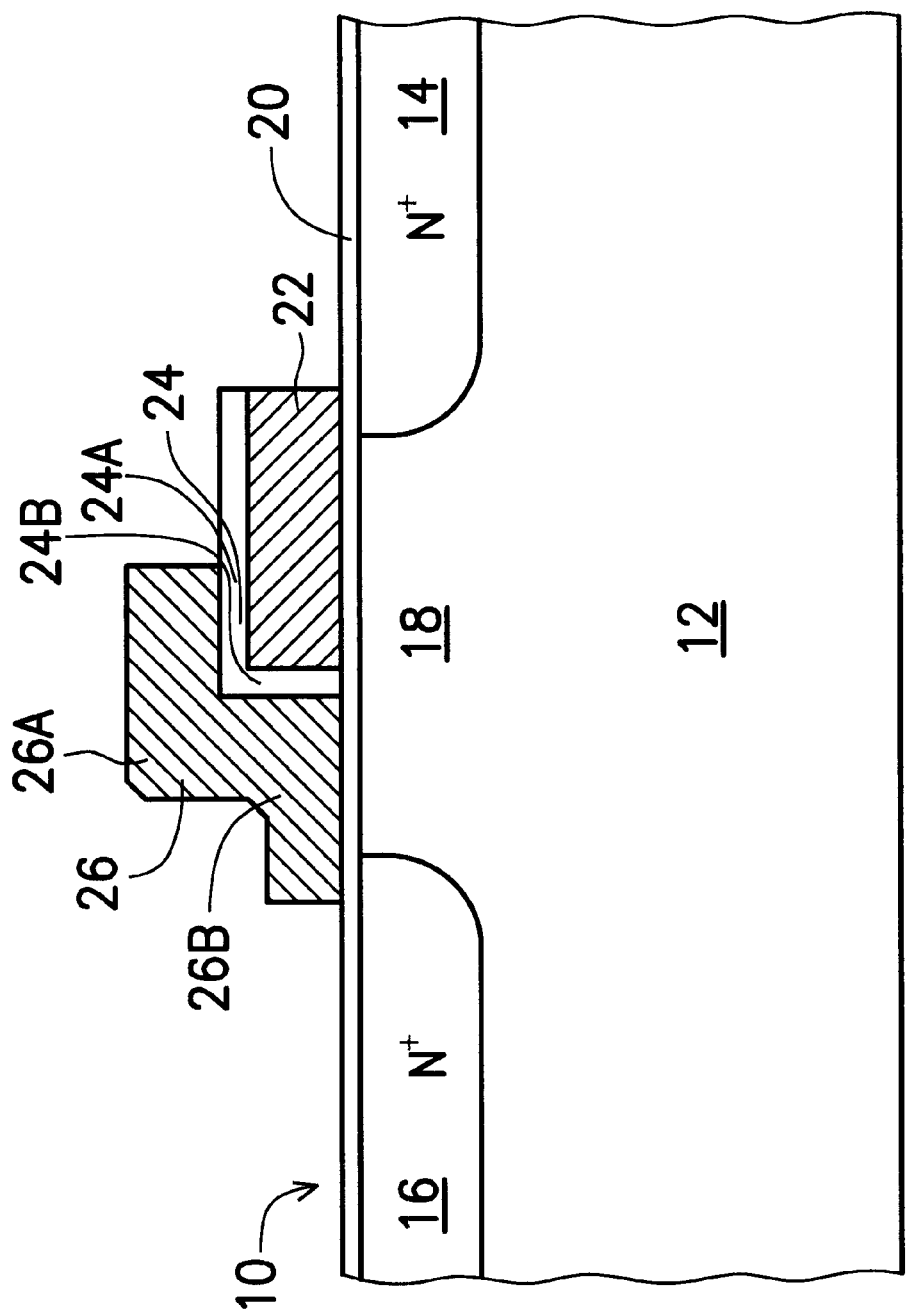
FIG. 1 depicts a conventional non-volatile memory cell fabricated onto a semiconductor substrate in a cross-sectional view.
Figure 2:
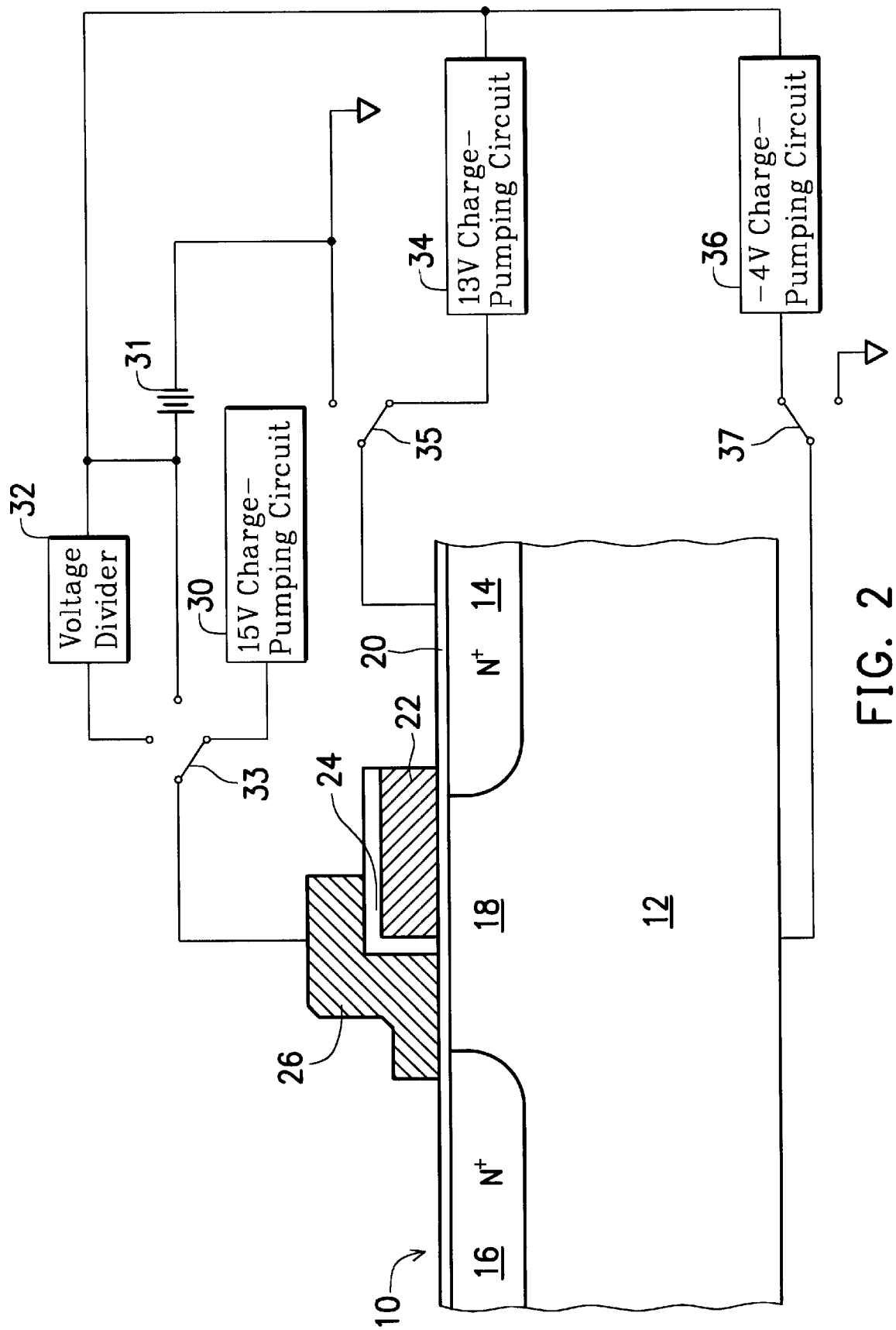
FIG. 2 depicts the circuit diagram of a control circuit for the non-volatile memory cell in accordance with one preferred embodiment of the present invention.

Referring to FIG. 2, a circuit for controlling a non-volatile memory cell in accordance with the one preferred embodiment of the present invention is illustrated. As shown in FIG. 2, the circuit comprises a +15V charge-pumping circuit 30, a voltage source 31, a voltage divider 32, a word-line switch 33, a +13V charge-pumping circuit 34, a source switch 35, a -4V charge-pumping circuit 36, and a bulk switch 37. In this embodiment, the voltage source 31 is exemplified to be a DC voltage source of +5 volts. The charge-pumping circuits 30, 34, and 36 are composed of energy-storing devices to convert 5V provided by the voltage source 31 into +15V, +13V, and -4V, respectively. The voltage divider 32 is used to decrease the 5V provided by the voltage source 31 to about the threshold voltage of the MOS structure defined by the control gate 26.

The word-line switch 33 is used to select +15V provided by the charge-pumping circuit 30, the voltage source 31, or the threshold voltage of the MOS structure defined by the control gate 26 provided by the voltage divider 32, and apply the selected voltage to the control gate 26. The source switch 35 is used to select +13V provided by the charge-pumping circuit 34 or the ground potential, and apply the selected voltage to the source region 14. The bulk switch 37 is used to select one of -4V provided by the charge-pumping circuit 36 and the ground potential, and apply the selected voltage to the substrate 12.

The control method for the non-volatile memory cell 10 according to the present invention is described as follows.

When it is desired to erase the cell 10, the source region 14 and the drain region 16 is high impedance. The word-line switch 33 selects and applies a positive voltage, on the order of about +15 volts provided by the charge-pumping circuit 30, to the control gate 26. Simultaneously, the bulk switch 37 selects and applies a negative voltage, on the order of about -4 volts provided by the charge-pumping circuit 36, to the substrate 12. Therefore, charges on the floating gate 22 are induced through the Fowler-Nordheim tunneling mechanism to tunnel through the second insulating layer 24 to the control gate 26, leaving the floating gate 22 positively charged.

When it is desired to program selective cell 10, a ground potential is applied to the drain region 16. The word-line switch 33 selects and applies a positive voltage level in the vicinity of the threshold voltage of the MOS structure defined by the control gate 26, on the order of approximately of +1V volt, to the control gate 26. Simultaneously, the source switch 35 selects and applies another positive voltage, on the order of about +13 volts provided by the charge-pumping circuit 34, to the source region 14, while the bulk switch 37 selects and applies the ground potential to the substrate 12. Therefore, electrons generated by the drain region 16 will flow from the drain region 16 towards the source region 14 through a weakly inverted channel region 18. When the electrons reach the region where the control gate 26 meets the sidewall portion 24B, the electrons see a steep potential drop approximately equal to the source voltage across the surface region defined by the gap of the sidewall 24B. The electrons will accelerate and become heated and some of them will be injected into and through the first insulating layer 20 onto the floating gate 22, leaving the floating gate 22 negatively charged.

When it is desired to read memory cell 10, the source switch 35 selects and applies the ground potential to the source region 14. The bulk switch 12 selects and applies the ground potential to the substrate 12. The word-line switch 33 selects and applies a read voltage (+5 volts provided by the voltage source 31) to the control gate 26, while the drain region 16 is powered by 5 volts. If the floating gate 22 is positively charged, the entire channel region 18 directly beneath the floating gate 22 and the portion 26B of the control gate 26 will be turned on to cause electrical current to flow from the source region 14 to the drain region 16. This would be the logic "1" state. On the other hand, if the floating gate 22 is negatively charged, the channel region 18 directly beneath the floating gate 22 is either weakly turned on or is entirely shut off so that little or no current will flow through the channel region 18 directly beneath the floating gate 22. In this manner, the cell 10 is sensed to be programmed at the logic "0" state.

Figure 3A:
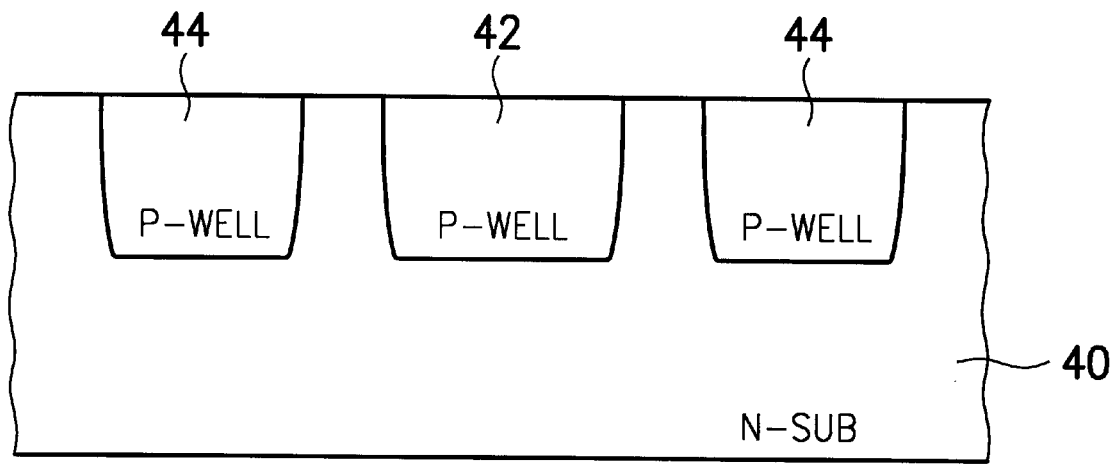
FIGS. 3A and 3B schematically depict the insulating structure between the non-volatile memory cell and peripheral circuitry in cross-sectional views.
Figure 3B:
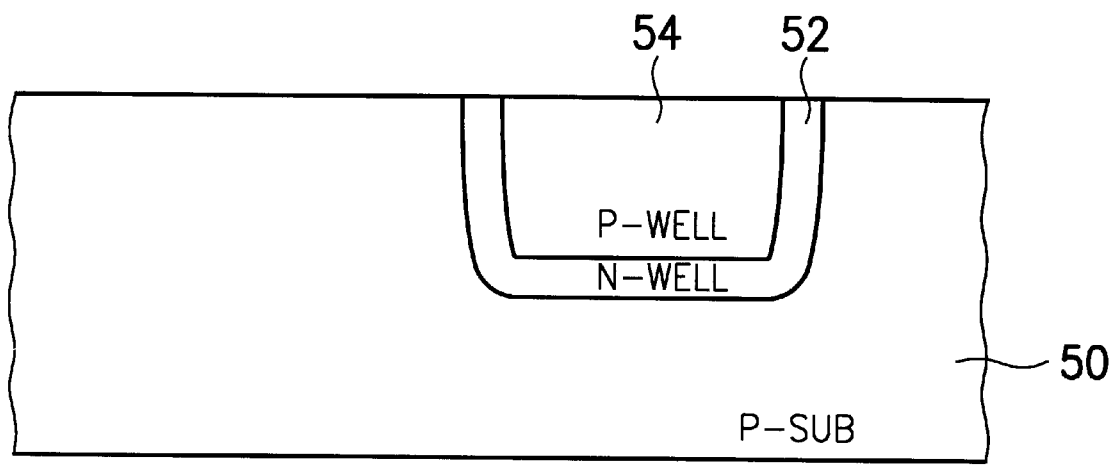

According to the present invention, a negative voltage should be applied to the bulk of the memory cell 10. To prevent the peripheral circuitry from incorrect operation, within an N-type semiconductor substrate 40 plural well regions 42, 44, and 46 are provided as shown in FIG. 3A, whereas the non-volatile memory cell 10 and peripheral circuitry are formed therein. For example, the non-volatile memory cell 10 is formed in the well 42, and peripheral circuits are formed in the wells 44 and 46. Besides, a P-type semiconductor substrate 50 is provided with an N-well 52 in which a P-well 54 is formed. The non-volatile memory cell 10 is formed in the P-well 54, and, therefore, electrically insulated from the P-type semiconductor substrate 50 on which the peripheral circuitry is provided by the N-well 52.

According to the present invention, a circuit for controlling a non-volatile memory cell and its control method applying a negative voltage at the bulk during the erase operation are provided. Accordingly, the potential difference between the substrate and the control gate can be raised to increase the number of charges to be stored in the floating gate even after long-term erase-program cycles.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A circuit for controlling a non-volatile memory cell having a split gate structure comprising a source, a drain, a floating gate that partially overlaps one of said source or drain, a control gate that partially overlaps the other of said source or drain on an end portion of said control gate and overlaps a portion of said floating gate on another end portion of said control gate, and a bulk, said control circuit comprising:

a voltage source;

a first charge-pumping circuit which generates a high first positive voltage;

a word-line switch for selecting and applying one of said voltage source or said first positive voltage to said control gate;

a second charge-pumping circuit which generates a second positive voltage;

a source switch for selecting and applying one of a ground potential or said second positive voltage to said source;

a third charge-pumping circuit which generates a negative voltage; and a bulk switch for selecting and applying one of said ground potential or said negative voltage to said bulk; and wherein said first and said second positive voltages are greater than a threshold voltage and said first positive voltage is greater than said second positive voltage.

2. The circuit as claimed in claim 1, further comprising a voltage divider for generating a threshold voltage of a MOS transistor defined by said control gate responsive to said voltage source.

3. The circuit as claimed in claim 1, wherein said non-volatile memory cell is fabricated on a P-well formed in an N-type semiconductor substrate.

4. The circuit as claimed in claim 1, wherein said non-volatile memory cell is fabricated on a P-well formed in an N-well, and said N-well is formed in a P-type semiconductor substrate.

5. The circuit as claimed in claim 1, wherein said a first charge-pumping circuit, said second charge-pumping circuit and said third charge-pumping circuit are connected to said voltage source.

6. The circuit as claimed in claim 1 wherein said first and said second positive voltages are high with respect to the threshold voltage.

7. The circuit as claimed in claim 6 wherein said first positive voltage is about 15 volts, said second positive voltage is about 13 volts and said threshold voltage is about positive one volt.

8. The circuit as claimed in claim 7 wherein said negative voltage is about a negative 4 volts.

9. A method for controlling a non-volatile memory cell having a split gate structure comprising a source, a drain, a control gate, and a bulk, said method comprising an erase operation that includes:

applying a positive voltage to said control gate;

applying a negative voltage to said bulk;

having said source at a high impedance; and having said drain at a high impedance.

* * * * *